(12) United States Patent
Lim

(10) Patent No.: US 11,418,697 B2
(45) Date of Patent: Aug. 16, 2022

(54) IMAGE SENSOR AND PHOTOGRAPHING APPARATUS INCLUDING THE SAME

(71) Applicant: SK hynix Inc., Icheon-si (KR)

(72) Inventor: Sung Woo Lim, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 19 days.

(21) Appl. No.: 17/026,521

(22) Filed: Sep. 21, 2020

(65) Prior Publication Data
US 2021/0258499 A1   Aug. 19, 2021

(30) Foreign Application Priority Data
Feb. 18, 2020  (KR) .......................... 10-2020-0019536

(51) Int. Cl.
*H04N 5/232*   (2006.01)
*H04N 5/225*   (2006.01)

(52) U.S. Cl.
CPC ..... *H04N 5/232122* (2018.08); *H04N 5/2254* (2013.01)

(58) Field of Classification Search
CPC .......................... H04N 5/232122; H04N 5/2254
See application file for complete search history.

(56) References Cited

U.S. PATENT DOCUMENTS

| | | | |
|---|---|---|---|
| 9,985,119 B2 | 5/2018 | Crocherie et al. | |
| 2013/0015545 A1* | 1/2013 | Toumiya | H01L 27/14605 257/E31.127 |
| 2014/0014818 A1* | 1/2014 | Cho | H01L 27/14609 257/435 |
| 2019/0012308 A1 | 1/2019 | Dvorak | |
| 2019/0028653 A1* | 1/2019 | Minami | H04N 5/23216 |
| 2019/0137732 A1* | 5/2019 | Sakurabu | G02B 7/34 |
| 2019/0341409 A1* | 11/2019 | Yamabi | H01L 27/14618 |
| 2019/0348452 A1* | 11/2019 | Ootsuka | H01L 27/14685 |
| 2020/0169704 A1* | 5/2020 | Fujii | H04N 5/374 |
| 2020/0210733 A1* | 7/2020 | Noble | G06V 40/193 |
| 2020/0228722 A1* | 7/2020 | Aoki | H04N 5/36961 |
| 2020/0280704 A1* | 9/2020 | Galor Gluskin | G06T 5/50 |
| 2020/0314376 A1* | 10/2020 | Kim | G01S 7/4816 |
| 2020/0322507 A1* | 10/2020 | Chen | H04N 5/22541 |
| 2020/0348455 A1* | 11/2020 | Summa | B29D 11/00278 |

* cited by examiner

*Primary Examiner* — Lin Ye
*Assistant Examiner* — John H Morehead, III
(74) *Attorney, Agent, or Firm* — Perkins Coie LLP

(57) ABSTRACT

The technology disclosed in this patent document can be implemented in embodiments to provide an image sensor that includes a first phase difference detection pixel having a light receiving region shifted by a first displacement distance, and a second phase difference detection pixel having a light receiving region shifted by a second displacement distance in a second direction opposite to the first direction, wherein the first and second phase difference detection pixels are structured to detect phase difference information of incident light for controlling focusing of incident light at the imaging pixels for image sensing by the imaging pixels, and each of the first phase difference detection pixel and the second phase difference detection pixel includes an antireflection layer structured to partially cover a microlens, in the light receiving region.

18 Claims, 16 Drawing Sheets

IMAGE SENSOR AND PHOTOGRAPHING APPARATUS INCLUDING THE SAME

CROSS-REFERENCES TO RELATED APPLICATION

This patent document claims the priority and benefits of Korean Patent Application No. 10-2020-0019536 filed on Feb. 18, 2020, which is incorporated herein by reference in its entirety.

TECHNICAL FIELD

The technology and implementations disclosed in this patent document generally relate to an image sensor having an autofocus function and a photographing apparatus including the same.

BACKGROUND

An image sensor is a device for capturing optical images by converting light into electrical signals using a photosensitive semiconductor material that reacts to light. With the recent development of automotive, medical, computer and communication industries, the demand for high-performance image sensors is increasing in various devices such as smartphones, digital cameras, game machines, Internet of Things, robots, security cameras and medical micro-cameras.

Image sensors may be generally divided into CCD (charge coupled device) image sensors and CMOS (complementary metal oxide semiconductor) image sensors. The CCD image sensors offer a better image quality, but they tend to consume more power and are larger as compared to CMOS image sensors. The CMOS image sensors smaller in size and consume less power than the CCD image sensors. In addition, the CMOS image sensors may be implemented using many different scanning schemes, and because CMOS sensors are fabricated using the CMOS fabrication technology, the CMOS image sensors and other signal processing circuitry can be integrated into a single chip, enabling the production of miniaturized image sensors at a lower cost. For these reasons, CMOS image sensors are being widely used.

An autofocus optical system uses a sensor, a control system and a motor to focus on an automatically or manually selected point or area. The autofocus system may be realized using a phase difference detection scheme or a contrast detection scheme. The phase difference detection scheme may be achieved by dividing the incoming light into pairs of images and comparing them. The contrast detection scheme is achieved by measuring contrast within a sensor field through the lens. In addition, there are many autofocus techniques that are being developed.

SUMMARY

This patent document provides, among others, designs of image sensors that include phase difference detection pixels, and a photographing apparatus including the same.

In another embodiment of the disclosed technology, an image sensor may include a plurality of imaging pixels to detect incident light to produce pixel signals representing an image carried by the incident light, a first phase difference detection pixel located among the imaging pixels and including a light receiving region shifted by a first displacement distance in a first direction, and a second phase difference detection pixel located among the imaging pixels and including a light receiving region shifted by a second displacement distance in a second direction opposite to the first direction, wherein the first and second phase difference detection pixels are structured to detect phase difference information of incident light for controlling focusing of incident light at the imaging pixels for image sensing by the imaging pixels, and each of the first phase difference detection pixel and the second phase difference detection pixel includes an antireflection layer structured to partially cover a microlens, in the light receiving region.

In another embodiment of the disclosed technology, a photographing apparatus may include an image sensor including a first phase difference detection pixel structured to include a light receiving region shifted by a first displacement distance in a first direction and a second phase difference detection pixel structured to include a light receiving region shifted by a second displacement distance in a second direction opposite to the first direction, a focus detector configured to calculate a defocus value based on a first phase difference detection signal of the first phase difference detection pixel and a second phase difference detection signal of the second phase difference detection pixel, and a lens driver configured to adjust a position of a lens disposed in front of the image sensor, depending on the defocus value, wherein each of the first phase difference detection pixel and the second phase difference detection pixel includes an antireflection layer structured to partially cover a microlens, in the light receiving region.

In another embodiment of the disclosed technology, an image sensor may include a plurality of photoelectric conversion elements structured to capture optical signals and detect a phase difference in the optical signals, a plurality of microlenses arranged over the plurality of photoelectric conversion elements to focus incident light on the plurality of photoelectric conversion elements, at least one light blocking layer structured to cover a portion of at least one of the microlenses to partially block light from reaching at least a portion of at least one of the plurality of photoelectric conversion elements, and at least one antireflection layer structured to cover another portion of the at least one of the microlenses to reduce a reflection of light at the at least one of the microlenses.

In another embodiment of the disclosed technology, an image sensor may include a first phase difference detection pixel having a light receiving region disposed by being deflected in a first direction, and a second phase difference detection pixel having a light receiving region disposed by being deflected in a second direction opposite to the first direction, wherein each of the first phase difference detection pixel and the second phase difference detection pixel includes an antireflection layer which covers a microlens, in the light receiving region.

In another embodiment of the disclosed technology, a photographing apparatus may include an image sensor including a first phase difference detection pixel which has a light receiving region disposed by being deflected in a first direction and a second phase difference detection pixel which has a light receiving region disposed by being deflected in a second direction opposite to the first direction, a focus detector configured to calculate a defocus value based on a first phase difference detection signal of the first phase difference detection pixel and a second phase difference detection signal of the second phase difference detection pixel, and a lens driver configured to adjust a position of a lens which is disposed in front of the image sensor, depending on the defocus value, wherein each of the first phase difference detection pixel and the second phase difference detection pixel includes an antireflection layer which covers a microlens, in the light receiving region.

In some embodiments of the disclosed technology, by disposing an antireflection layer with high performance in a light receiving region of each phase difference detection pixel, it is possible to prevent the optical sensitivity of the phase difference detection pixel from being degraded.

Besides, a variety of effects directly or indirectly understood through the present document may be provided.

DETAILED DESCRIPTION

Hereinafter, various embodiments of the disclosed technology will be disclosed with reference to the accompanying drawings. However, the description is not intended to limit the disclosed technology to particular embodiments, and it should be construed as including various modifications, equivalents, and/or alternatives according to the embodiments discussed in this patent document.

Figure 1:
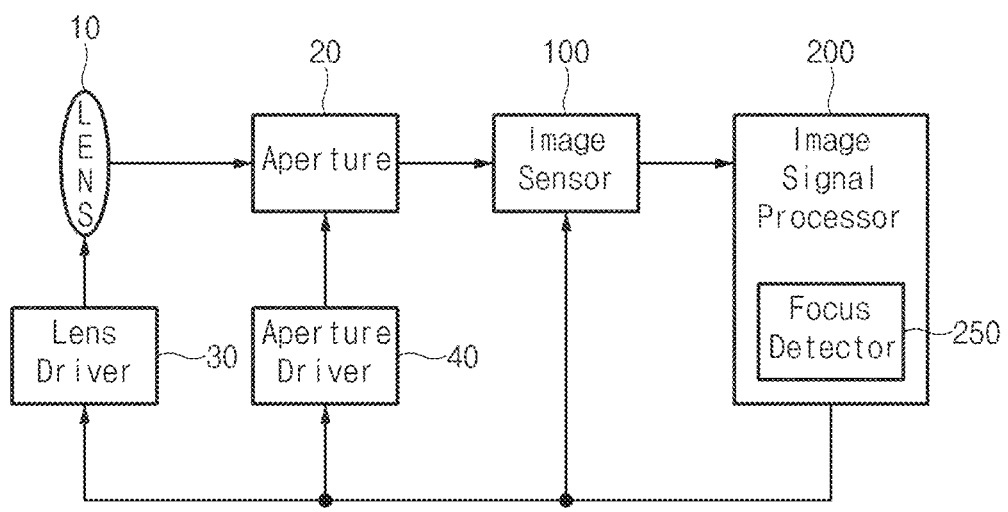
FIG. 1 is a diagram illustrating an example of a photographing apparatus based on an embodiment of the disclosed technology.

FIG. 1 is a diagram illustrating an example of a photographing apparatus 1 based on an embodiment of the disclosed technology.

In some implementations, the photographing apparatus 1 may indicate a digital still camera that captures photographs or a digital video camera that captures motion picture information. Examples of the photographing apparatus 1 may include a digital single lens reflex camera (DSLR), a mirrorless camera, and a smartphone. The photographing apparatus 1 may include any type of apparatus capable of photographing a subject and generating an image using a lens and an imaging device.

The photographing apparatus 1 may include a lens 10, an aperture 20, a lens driver 30, an aperture driver 40, an image sensor 100, and an image signal processor 200.

The lens 10 may include at least one lens aligned with respect to an optical axis. The lens 10 may be disposed in front of the image sensor 100 to focus an optical signal onto the image sensor 100. The lens driver 30 may adjust the position of the lens 10. For example, the lens 10 may be moved along the optical axis by the lens driver 30.

The aperture 20 may indicate the opening of a lens's diaphragm through which light passes. The opening can be adjusted by the aperture driver 40 to adjust an amount of light incident on the image sensor 100.

Light rays transmitted through the lens 10 and the aperture 20 may be incident on a light receiving surface of the image sensor 100 to form an image based on the light rays.

The lens driver 30 may adjust a position of the lens 10 according to a control signal provided from the image signal processor 200. By adjusting a position of the lens 10, the lens driver 30 may perform operations such as autofocus, zoom change and focus change.

The aperture driver 40 may adjust the size of the opening of the aperture 20 according to a control signal provided from the image signal processor 200. By adjusting the size of the opening of the aperture 20, the aperture driver 40 may control exposure setting values to adjust an amount of light that reaches the image sensor 100.

The image sensor 100 may be a complementary metal oxide semiconductor image sensor (CIS) which converts an optical signal into an electrical signal. The image sensor 100 may be adjusted in its turn-on/off, operation mode, sensitivity, and so forth by the image signal processor 200. A more detailed configuration and operation of the image sensor 100 will be described later with reference to FIG. 2.

The image signal processor 200 may process image data obtained from the image sensor 100, and may control respective components of the photographing apparatus 1 depending on a processing result or an external input signal. The image signal processor 200 may reduce noise in image data, and may perform image signal processing for improving image quality, such as gamma correction, color filter array interpolation, color matrix, color correction and color enhancement. Also, the image signal processor 200 may generate an image file by compressing image data generated by performing the image signal processing for improving image quality, or may restore the image data from the image file. An image compression format may be a reversible format or an irreversible format. As an example of the compression format, in the case of a still image, a JPEG (Joint Photographic Experts Group) format, a JPEG 2000 format, or a similar format may be used. In the case of a video, a video file may be generated by compressing a plurality of frames according to the MPEG (Moving Picture Experts Group) standard. Image files may be generated according to the Exif (exchangeable image file format) standard, for example.

Image data outputted from the image signal processor 200 may be stored in an internal memory or an external memory of the photographing apparatus 1 or be displayed on a display, automatically or according to a user's request.

Further, the image signal processor 200 may perform unsharpening processing, blur processing, edge enhancement processing, image analysis processing, image recognition processing, image effect processing, for example.

In addition, the image signal processor 200 may perform display image signal processing for a display device. For example, the image signal processor 200 may perform luminance level adjustment, color correction, contrast adjustment, outline enhancement adjustment, screen division processing, character image generation, image synthesis processing, for example.

The image signal processor 200 may control the lens driver 30, the aperture driver 40 and the image sensor 100 according to a control signal automatically generated by an image signal obtained in real time or a control signal manually generated by a user's operation.

In an embodiment, the image signal processor 200 and a focus detector 250 may be integrated into a single device. In another embodiment, the focus detector 250 and the image signal processor 200 may be implemented as separate devices.

The focus detector 250 may detect a focus of an image, based on pixel signals of a plurality of phase difference detection pixels included in the image sensor 100. In one example, the focus detector 250 may calculate a defocus value by performing a correlation operation through comparing the pixel signals of the phase difference detection pixels.

In some implementations, the focus detector 250 may calculate a pixel shift value that minimizes a correction operation value (sum of absolute difference: SAD) between pixel signals of first phase difference detection pixels and pixel signals of second phase difference detection pixels. The focus detector 250 may calculate a defocus value corresponding to the calculated pixel shift value, by referring to a table in which pixel shift values and defocus values are stored in advance by being mapped to each other. The pixel shift value may be a value that indicates how much an image corresponding to the first phase difference detection pixels and an image corresponding to the second phase difference detection pixels are deflected with respect to an optical axis. The defocus value may be a control signal capable of adjusting a focal distance by controlling the lens driver 30. The lens driver 30 may move the lens 10 to a position corresponding to the defocus value.

Figure 2:
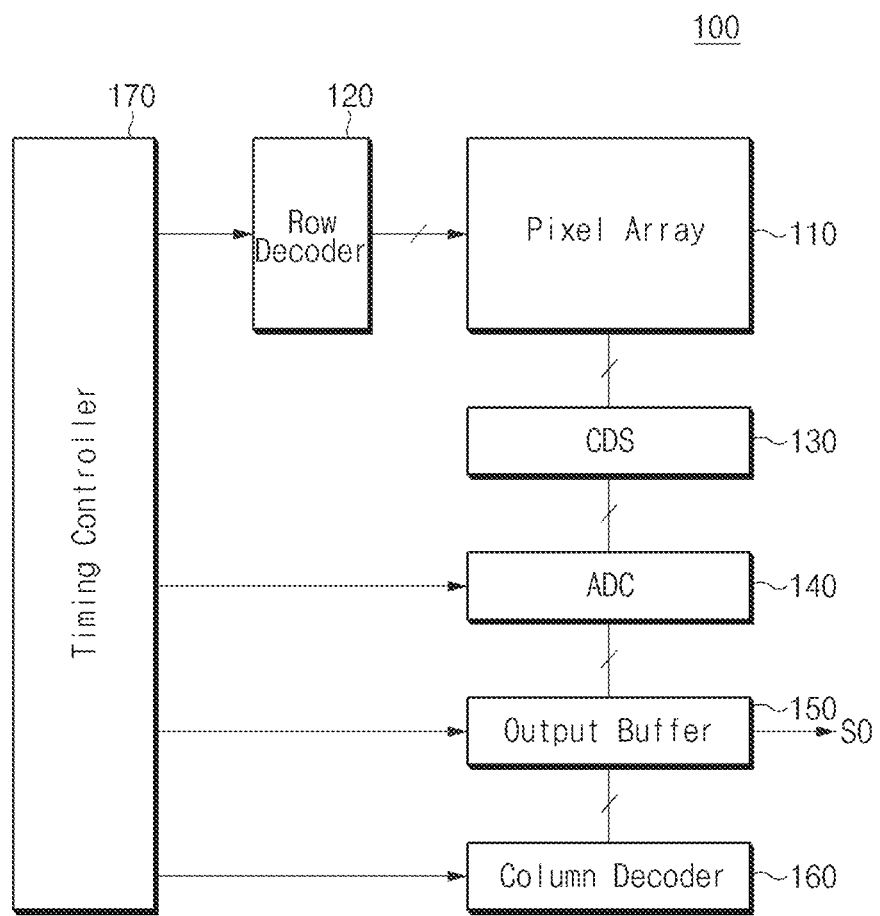
FIG. 2 is a block diagram schematically illustrating an example of an image sensor illustrated in FIG. 1.

FIG. 2 is a block diagram schematically illustrating an example of the image sensor illustrated in FIG. 1.

In some implementations, the image sensor 100 may include a pixel array 110, a row decoder 120, a correlated double sampler (CDS) 130, an analog-digital converter (ADC) 140, an output buffer 150, a column decoder 160, and a timing controller 170.

The pixel array 110 may include a plurality of unit pixels arranged in rows and columns in a two-dimensional matrix. The plurality of unit pixels may each convert an optical signal into an electrical signal, or may convert an optical signal into an electrical signal on the basis of shared pixels in an implementation in which at least two unit pixels share at least one element. Each unit pixel or shared pixel may correspond to a 3T pixel (3 transistors per pixel), a 4T pixel (4 transistors per pixel) or a 5T pixel (5 transistors per pixel), or may include more than 5 transistors per pixel. The pixel array 110 may receive a driving signal including a row select signal, a pixel reset signal and a transfer signal, from the row decoder 120, and may be operated by the driving signal.

The row decoder 120 may activate the pixel array 110 based on control signals and/or clock signals from the timing controller 170. In some implementations, in selecting at least one row of the pixel array 110, the row decoder 120 may generate the row select signal to select at least one row among the plurality of rows. The row decoder 120 may sequentially enable the pixel reset signal and the transfer signal with respect to pixels corresponding to the selected at least one row. In this way, an analog type reference signal and an analog type image signal which are generated from each of the pixels of the selected row may be sequentially transferred to the correlated double sampler 130. Here, the reference signal and the image signal may be collectively referred to as a pixel signal.

The correlated double sampler 130 may sequentially sample and hold reference signals and image signals provided to a plurality of respective column lines from the pixel array 110. In other words, the correlated double sampler 130 may sample and hold the levels of a reference signal and an image signal corresponding to each of the columns of the pixel array 110.

The correlated double sampler 130 may transfer a reference signal and an image signal of each of the columns to the ADC 140 as a correlated double sampling signal, under the control of the timing controller 170.

The ADC 140 may convert the correlated double sampling signal for each of the columns which is outputted from the correlated double sampler 130, into a digital signal, and may output the digital signal. The ADC 140 may perform a counting operation and a calculation operation based on the correlated double sampling signal for each column and a ramp signal provided from the timing controller 170, and thus, may generate digital-type image data from which noise corresponding to each column (e.g., reset noise specific to each pixel) is removed.

The ADC 140 may include a plurality of column counters corresponding to the respective columns of the pixel array 110. The ADC 140 may convert correlated double sampling signals corresponding to the respective columns, into digital signals, by using the column counters, and thereby, may generate image data. In another embodiment, the ADC 140 may include one global counter, and may convert correlated double sampling signals corresponding to the respective columns into digital signals by using a global code provided from the global counter.

The output buffer 150 may capture and output each image data, in column unit, provided from the ADC 140. The output buffer 150 may temporarily store image data outputted from the ADC 140, under the control of the timing controller 170. The output buffer 150 may operate as an interface which compensates for a difference in transfer (or processing) speed between the image sensor 100 and another device coupled thereto.

The column decoder 160 may select a column of the output buffer 150 under the control of the timing controller 170, and image data temporarily stored in the selected column of the output buffer 150 may be sequentially outputted. In detail, the column decoder 160 may receive an address signal from the timing controller 170, may select a column of the output buffer 150 by generating a column select signal based on the address signal, and thereby, may control image data from the selected column of the output buffer 150 to be outputted as an output signal SO.

The timing controller 170 may control the row decoder 120, the ADC 140, the output buffer 150, and the column decoder 160.

The timing controller 170 may provide a clock signal required for the operation of each component of the image sensor 100, a control signal for timing control and address signals for selecting a row and a column, to the row decoder 120, the column decoder 160, the ADC 140 and the output buffer 150. In an embodiment, the timing controller 170 may include a logic control circuit, a phase-locked loop (PLL) circuit, a timing control circuit and a communication interface circuit.

Figure 3:
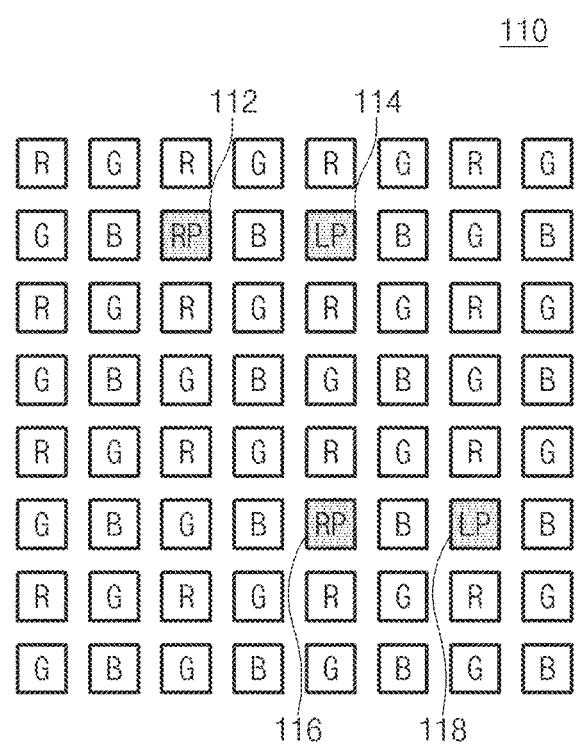
FIG. 3 is a diagram illustrating an example of a pixel array illustrated in FIG. 2.

FIG. 3 is a diagram illustrating an example of the pixel array illustrated in FIG. 2.

In some implementations, the pixel array 110 may include a plurality of pixels which are arranged in an 8×8 matrix. Although FIG. 3 illustrates the plurality of pixels arranged in a Bayer pattern in an 8×8 matrix by way of example only, the plurality of pixels may be arranged in any type of pattern and in a matrix of any numbers of rows and columns.

The pixel array 110 may include color pixels (R (red) pixels, G (green) pixels and B (blue) pixels) which are arranged according to the Bayer patterns. The G pixels may be divided into Gr pixels which are disposed at the same rows as the R pixels and Gb pixels which are disposed at the same rows as the B pixels. Also, the pixel array 110 may include first phase difference detection pixels (RP) 112 and 116 and second phase difference detection pixels (LP) 114 and 118 which are discretely distributed. The positions and numbers of the first phase difference detection pixels 112 and 116 and the second phase difference detection pixels 114 and 118 included in the pixel array 110 are for an illustration purpose only. In FIG. 3, the first phase difference detection pixels 112 and 116 and the second phase difference detection pixels 114 and 118 are disposed at positions of Gb pixels in Bayer patterns. The first phase difference detection pixel 112 or 116 and the second phase difference detection pixel 114 or 118 are included in adjacent Bayer patterns so as to be positioned as close as possible to each other. In this way, the first and second phase difference detection pixels can receive the same optical signal at the same position to perform a more accurate phase difference detection. The first and second phase difference detection pixels are included in left and right Bayer patterns adjacent to each other. However, in another embodiment, the first and second phase difference detection pixels may be included in upper and lower Bayer patterns adjacent to each other.

As the first phase difference detection pixels 112 and 116 and the second phase difference detection pixels 114 and 118 are disposed in the place of the Gb pixels in the Bayer patterns, the phase difference detection pixels may correspond to defective pixels in view of color image. Such defective pixels may be corrected by the color interpolation operation of the image signal processor 200. For example, the information of a defective Gb pixel may be calculated using an average value of four G pixels included in a 3×3 matrix that includes a corresponding phase difference detection pixel at its center.

Each of the first phase difference detection pixels 112 and 116 may have a limited light receiving region shifted by a certain displacement distance in a first direction (e.g., a right direction) defined in a row direction. On the contrary, each of the second phase difference detection pixels 114 and 118 may have a limited light receiving region shifted by a certain displacement distance in a second direction (e.g., a left direction) opposite to the first direction. The limited light receiving region of each of the first phase difference detection pixels 112 and 116 and the second phase difference detection pixels 114 and 118 may extend in a column direction perpendicular to the row direction.

Since the image sensor 100 includes the phase difference detection pixels RP and LP, the image sensor 100 may have an exit pupil different from that of a general image sensor. The image sensor 100 based on some embodiments of the disclosed technology may have the exit pupil combining an exit pupil of the color pixels R, G and B defined as a circle or an ellipse centered on the optical axis, an exit pupil of the first phase difference detection pixels RP defined as a circle or an ellipse shifted by a certain displacement distance in the first direction from the optical axis and an exit pupil of the second phase difference detection pixels LP defined as a circle or an ellipse shifted by a certain displacement distance in the second direction from the optical axis. In some embodiments of the disclosed technology, by such a combination of the exit pupils, the image sensor 100 may generate a color signal according to incident light, and, at the same time, may detect a phase difference for an autofocus operation.

Figure 4A:
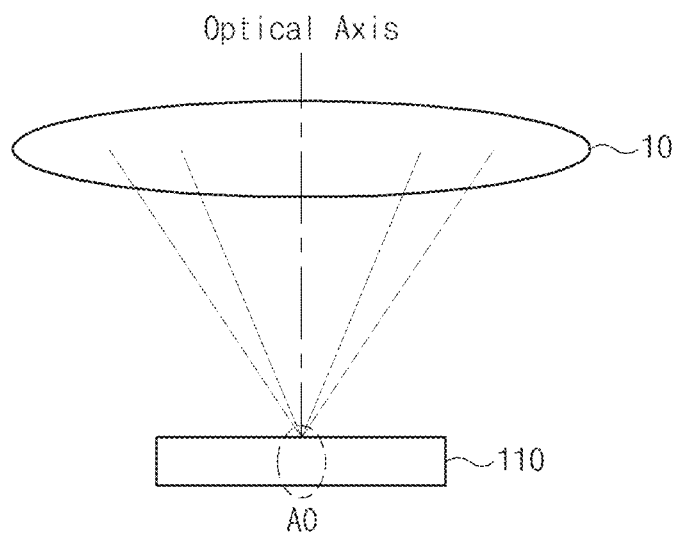
FIGS. 4A-4C illustrate an example of an autofocus operation based on some embodiments of the disclosed technology.
Figure 4B:
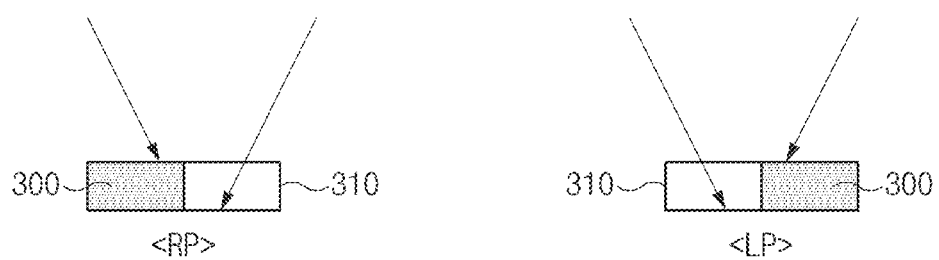
Figure 4C:
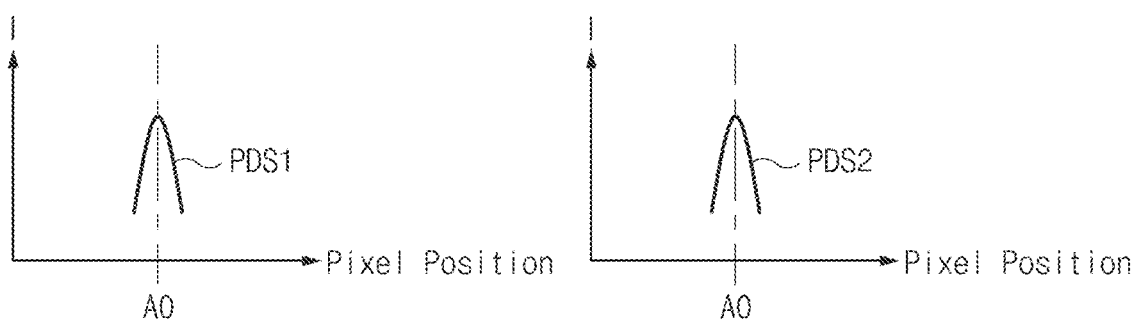

FIGS. 4A-4C illustrate an example of an autofocus operation based on some embodiments of the disclosed technology.

More specifically FIGS. 4A-4C illustrate a case where a focus state for a subject is an in-focus state. In the in-focus state, as illustrated in FIG. 4A, an optical signal incident on the image sensor 100 through the lens 10 is focused at a center part A0 of the light receiving surface of the image sensor 100.

In such an in-focus state, as illustrated in FIG. 4B, both the first phase difference detection pixel RP and the second phase difference detection pixel LP at the center part A0 of the light receiving surface may receive light, and valid phase difference detection signals may be detected at the center part A0. The first phase difference detection pixel RP has a light blocking region 300 disposed at a left side and a limited light receiving region 310 shifted by a certain displacement distance in a right direction. The second phase difference detection pixel LP has a light blocking region 300 disposed at a right side and a limited light receiving region 310 shifted by a certain displacement distance in a left direction.

The focus detector 250 may calculate a pixel shift value that minimizes a correlation operation value, through a correlation operation between a first phase difference detection signal PDS1 generated by the first phase difference detection pixels RP and a second phase difference detection signal PDS2 generated by the second phase difference detection pixels LP. As illustrated in FIG. 4C, by comparing (by performing a correlation calculation) a pattern of the first phase difference detection signal PDS1 and a pattern of the second phase difference detection signal PDS2 which are plotted on graphs for pixel position and signal intensity, the focus detector 250 may calculate a pixel shift value that is required to match (or approximate) the pattern of the first phase difference detection signal PDS1 and the pattern of the second phase difference detection signal PDS2. If the calculated pixel shift value is equal to or less than a predetermined threshold value, a focus state may be determined as the in-focus state, and the focus detector 250 may control the lens driver 30 not to move the lens 10.

Figure 5A:
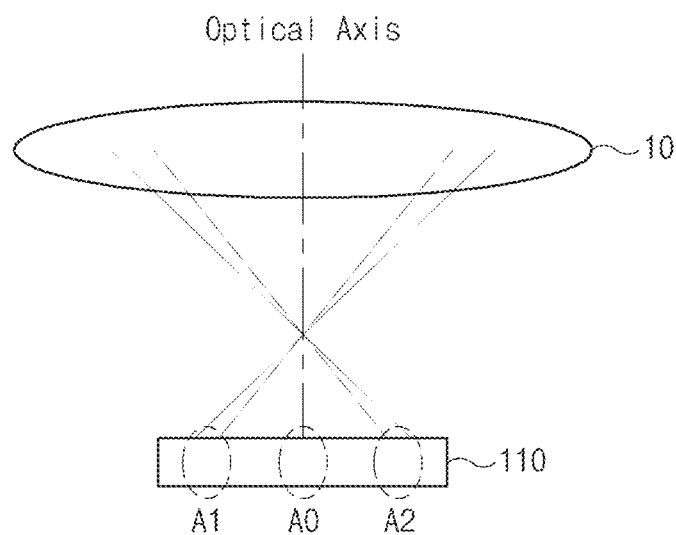
FIGS. 5A-5C illustrate an example of an autofocus operation based on some embodiments of the disclosed technology.
Figure 5B:
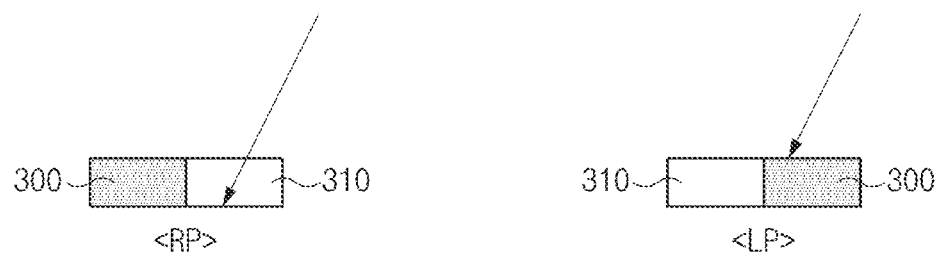
Figure 5C:
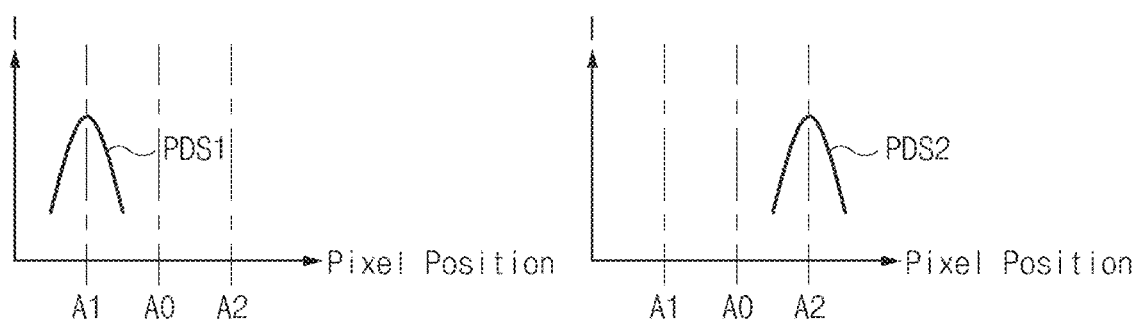

FIGS. 5A-5C illustrate an example of an autofocus operation based on some embodiments of the disclosed technology.

More specifically FIGS. 5A-5C illustrate a case where a focus state for a subject is a front focus state. In the front focus state, as illustrated in FIG. 5A, an optical signal incident on the image sensor 100 through the lens 10 is focused not at the center part A0 of the light receiving surface of the image sensor 100 but in front of the light receiving surface.

In such a front focus state, as illustrated in FIG. 5B, in a first region A1 which is positioned in the left direction from the optical axis, since the first phase difference detection pixel RP has the limited light receiving region 310 shifted by a certain displacement distance in the right direction, an optical signal may reach the first phase difference detection pixel RP. However, since the second phase difference detection pixel LP has the limited light receiving region 310 shifted by a certain displacement distance in the left direction, an optical signal is blocked by the light blocking region 300 and thus cannot reach the second phase difference detection pixel LP. Conversely, in a second region A2 which is positioned in the right direction from the optical axis, an optical signal cannot reach the first phase difference detection pixel RP, but may reach the second phase difference detection pixel LP.

As illustrated in FIG. 5C, only a pattern of the first phase difference detection signal PDS1 is plotted in the first region A1, and only a pattern of the second phase difference detection signal PDS2 is plotted in the second region A2. The focus detector 250 may calculate a pixel shift value that is required to match (or approximate) the pattern of the first phase difference detection signal PDS1 and the pattern of the second phase difference detection signal PDS2. The focus detector 250 may calculate a defocus value corresponding to the pixel shift value, and may transfer the defocus value to the lens driver 30, thereby moving the lens 10 to an in-focus position. For example, the defocus value may be an integer with a sign. Here, the sign may indicate a direction in which the lens 10 is to be moved away from or toward the light receiving surface of the image sensor 100, and an absolute value of the defocus value may indicate an amount of movement of the lens 10. In other words, as illustrated in FIG. 5C, in the case of the front focus state, the defocus value may have a positive sign indicating a direction of moving the lens 10 toward the light receiving surface, and may have an absolute value proportional to the pixel shift value.

Figure 6A:
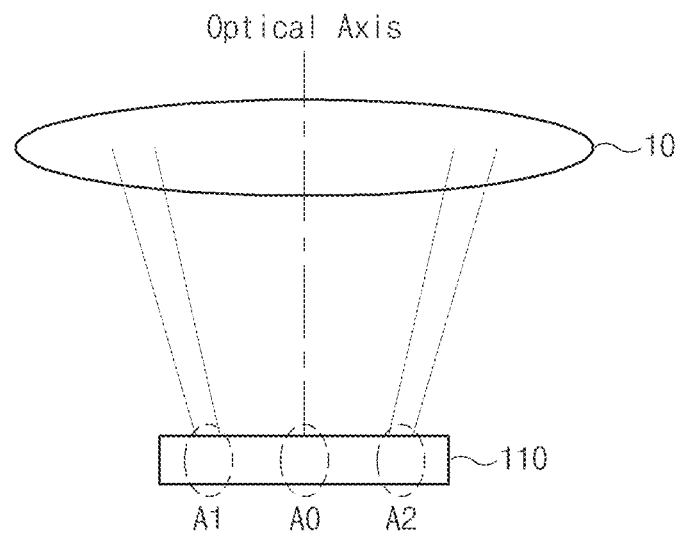
FIGS. 6A-6C illustrate an example of an autofocus operation based on some embodiments of the disclosed technology.
Figure 6B:
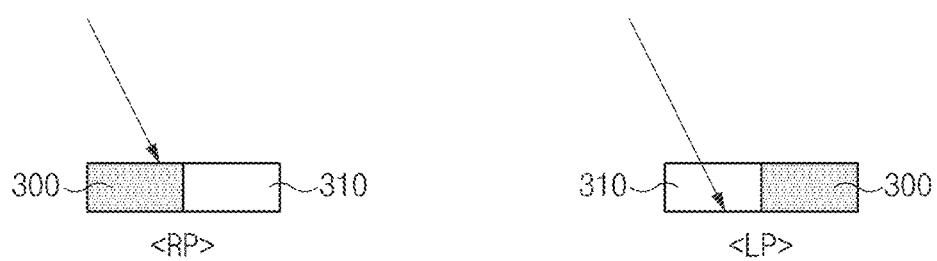
Figure 6C:
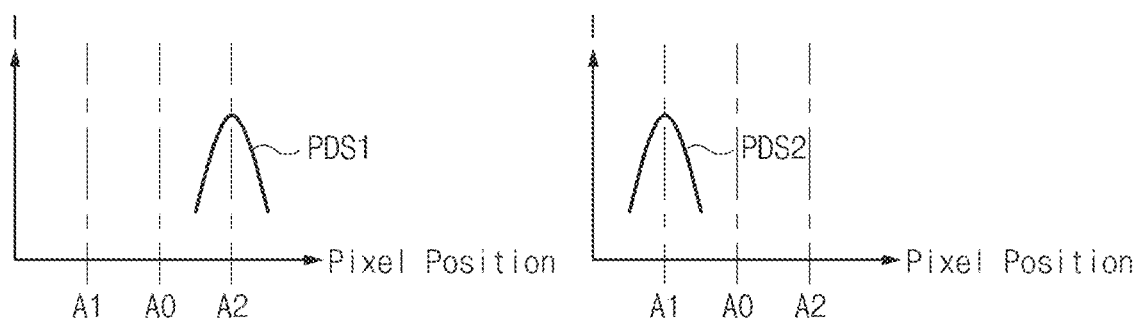

FIGS. 6A-6C illustrate an example of an autofocus operation based on some embodiments of the disclosed technology.

More specifically FIGS. 6A-6C illustrate a case where a focus state for a subject is a back focus state. In the back focus state, as illustrated in FIG. 6A, an optical signal incident on the image sensor 100 through the lens 10 is focused not at the center part A0 of the light receiving surface of the image sensor 100 but behind the light receiving surface.

In such a back focus state, as illustrated in FIG. 6B, in the first region A1 which is positioned in the left direction from the optical axis, since the first phase difference detection pixel RP has the limited light receiving region 310 shifted by a certain displacement distance in the right direction, an optical signal is blocked by the light blocking region 300 and thus cannot reach the first phase difference detection pixel RP. However, since the second phase difference detection pixel LP has the limited light receiving region 310 shifted by a certain displacement distance in the left direction, an optical signal may reach the second phase difference detection pixel LP. Conversely, in the second region A2 which is positioned in the right direction from the optical axis, an optical signal may reach the first phase difference detection pixel RP, but cannot reach into the second phase difference detection pixel LP.

As illustrated in FIG. 6C, only a pattern of the second phase difference detection signal PDS2 is plotted in the first region A1, and only a pattern of the first phase difference detection signal PDS1 is plotted in the second region A2. The focus detector 250 may calculate a pixel shift value that is required to match (or approximate) the pattern of the first phase difference detection signal PDS1 and the pattern of the second phase difference detection signal PDS2. The focus detector 250 may calculate a defocus value corresponding to the pixel shift value, and may transfer the defocus value to the lens driver 30, thereby moving the lens 10 to the in-focus position. For example, the defocus value may be an integer with a sign. Here, the sign may indicate a direction in which the lens 10 is to be moved away from or toward the light receiving surface of the image sensor 100, and an absolute value of the defocus value may indicate an amount of movement of the lens 10. In other words, as illustrated in FIG. 6C, in the case of the back focus state, the defocus value may have a negative sign indicating a direction of moving the lens 10 away from the light receiving surface, and may have an absolute value proportional to the pixel shift value.

Figure 7:
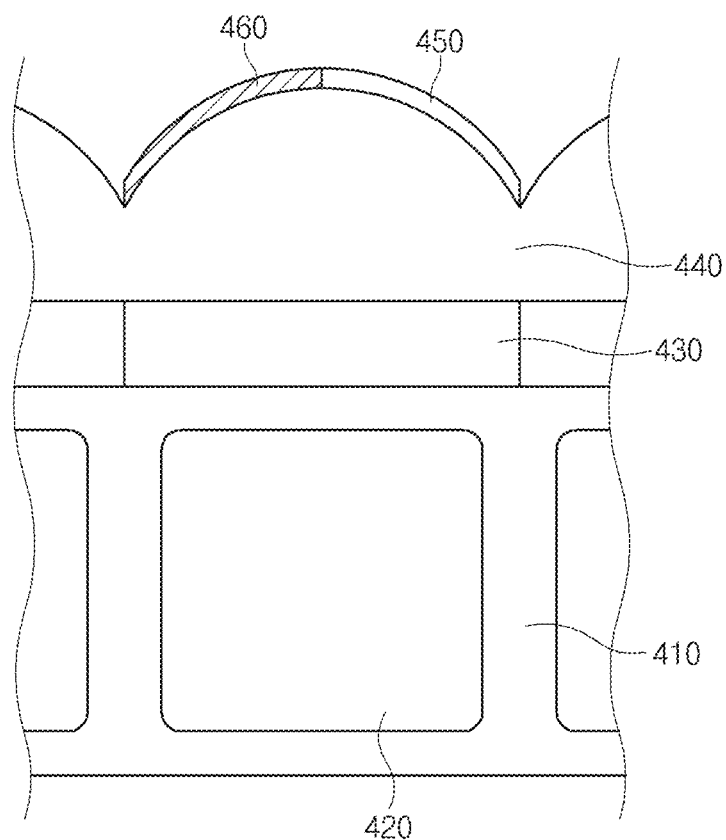
FIG. 7 is a cross-sectional view illustrating an example of a first phase difference detection pixel.

FIG. 7 is a cross-sectional view illustrating an example of a first phase difference detection pixel.

Referring to FIG. 7, a cross-section 400-1 of the first phase difference detection pixel may be a cross-section taken by cutting the first phase difference detection pixel RP illustrated in FIG. 3. A cutting direction may be the row direction or the column direction.

The cross-section 400-1 of the first phase difference detection pixel may include a substrate 410, a photoelectric conversion element 420, an optical filter 430, a microlens 440, an antireflection layer 450, and a light blocking layer 460.

The substrate 410 may be a silicon substrate including a top surface and a bottom surface which face away from each other. For example, the substrate 410 may be a P type or N type bulk substrate, a substrate in which a P type or N type epitaxial layer is grown in a P type bulk substrate, or a substrate in which a P type or N type epitaxial layer is grown in an N type bulk substrate.

The photoelectric conversion element 420 may be disposed in a region corresponding to the first phase difference detection pixel RP, in the substrate 410. The photoelectric conversion element 420 may generate and accumulate photocharges corresponding to the intensity of incident light. The photoelectric conversion elements 420 may be formed over as wide an area as possible in order to increase a fill factor representing light receiving efficiency. For example, the photoelectric conversion element 420 may be realized by a photodiode, a phototransistor, a photogate, a pinned photodiode or a combination thereof.

Examples of the photoelectric conversion element 420 includes a photodiode. In this case, the photoelectric conversion element 420 may be formed as an N type doped region through an ion implantation process of implanting N type ions. In an embodiment, the photodiode may be formed in a form in which a plurality of doped regions are stacked on top of one another. In this case, an underlying doped region may be formed by implanting P type ions and N+ type ions, and an overlying doped region may be formed by implanting N-type ions.

The optical filter 430 may be formed on the top of the substrate 410, and may selectively transmit light having a specific wavelength (for example, infrared rays, red, green or blue light). In an embodiment, the optical filter 430 may be a color filter the same as a color pixel (e.g., a G pixel) on a Bayer pattern corresponding to the position of the first phase difference detection pixel RP. In another embodiment, the optical filter 430 may be omitted from the first phase difference detection pixel RP.

The microlens 440 may be formed on the top of the optical filter 430, and may increase light gathering power for incident light to improve light receiving efficiency.

The antireflection layer 450 may cover a right half of the top of the microlens 440 when viewed from the center of the first phase difference detection pixel RP. The antireflection layer 450 may prevent the scattered reflection of an optical signal incident from the outside to suppress a flare characteristic and increase light receiving efficiency. A more detailed configuration of the antireflection layer 450 and a process for forming the antireflection layer 450 will be described later with reference to FIG. 9.

The light blocking layer 460 may cover a left half of the top of the microlens 440 when viewed from the center of the first phase difference detection pixel RP. The light blocking layer 460 may block (reflect or absorb) an optical signal incident from the outside not to transfer the optical signal into the first phase difference detection pixel RP. For example, the light blocking layer 460 may be tungsten, but the scope of the disclosed technology is not limited thereto.

As the left half of the top of the microlens 440 is covered by the light blocking layer 460, the light blocking region 300 of the first phase difference detection pixel RP may be realized. Moreover, as the right half of the top of the microlens 440 is covered by the antireflection layer 450, the light receiving region 310 of the first phase difference detection pixel RP may be realized. Although, due to the presence of the light blocking layer 460, an amount of an optical signal incident on the photoelectric conversion element 420 of the first phase difference detection pixel RP is smaller than that in the case of a color pixel having no light blocking layer 460, the antireflection layer 450 may minimize reflection by the microlens 440 to prevent light sensitivity from decreasing.

Figure 8:
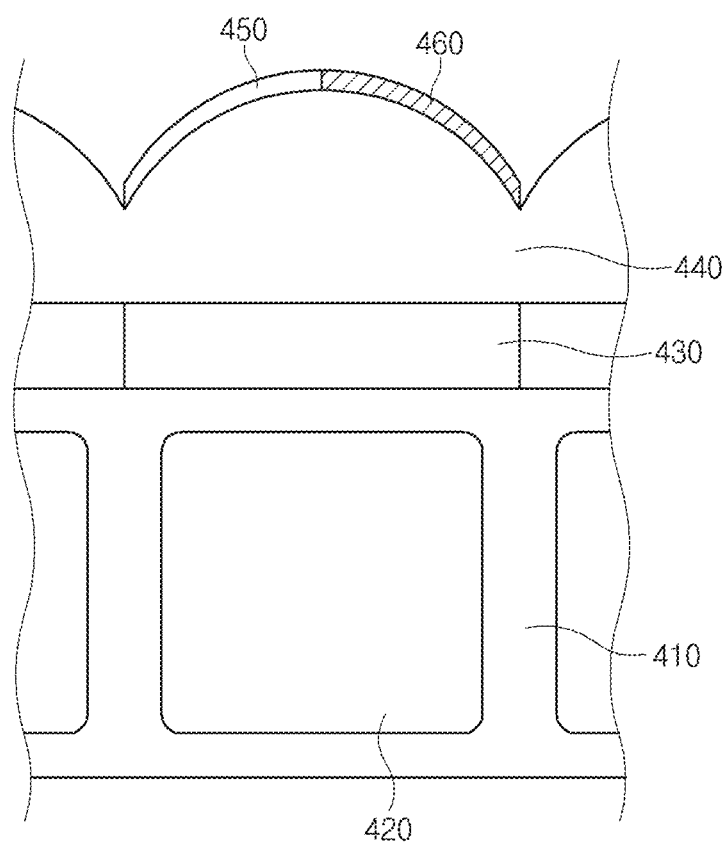
FIG. 8 is a cross-sectional view illustrating an example of a second phase difference detection pixel.

FIG. 8 is a cross-sectional view illustrating an example of a second phase difference detection pixel.

Referring to FIG. 8, a cross-section 400-2 of the second phase difference detection pixel may be a cross-section taken by cutting the second phase difference detection pixel LP illustrated in FIG. 3. A cutting direction may be the row direction or the column direction, but may be the same direction as that of the cross-section 400-1 of the first phase difference detection pixel described above with reference to FIG. 7.

The cross-section 400-2 of the second phase difference detection pixel may include the substrate 410, the photoelectric conversion element 420, the optical filter 430, the microlens 440, the antireflection layer 450, and the light blocking layer 460. Since the cross-section 400-2 of the second phase difference detection pixel has, except for some differences, a structure and function corresponding to those of the cross-section 400-1 of the first phase difference detection pixel described above with reference to FIG. 7, only the differences from the cross-section 400-1 of the first phase difference detection pixel will be mainly described below for the sake of convenience in explanation.

The antireflection layer 450 may cover a left half of the top of the microlens 440 when viewed from the center of the second phase difference detection pixel LP. The antireflection layer 450 may prevent the scattered reflection of an optical signal incident from the outside to suppress a flare characteristic and increase light receiving efficiency. A more detailed configuration of the antireflection layer 450 and a process for forming the antireflection layer 450 will be described later with reference to FIG. 9.

The light blocking layer 460 may cover a right half of the top of the microlens 440 when viewed from the center of the second phase difference detection pixel LP. The light blocking layer 460 may block (reflect or absorb) an optical signal incident from the outside not to transfer the optical signal into the second phase difference detection pixel LP. For example, the light blocking layer 460 may be tungsten, but the scope of the disclosed technology is not limited thereto.

As the right half of the top of the microlens 440 is covered by the light blocking layer 460, the light blocking region 300 of the second phase difference detection pixel LP may be realized. Moreover, as the left half of the top of the microlens 440 is covered by the antireflection layer 450, the light receiving region 310 of the second phase difference detection pixel LP may be realized. Although, due to the presence of the light blocking layer 460, an amount of an optical signal incident on the photoelectric conversion element 420 of the second phase difference detection pixel LP is smaller than in the case of a color pixel having no light blocking layer 460, the antireflection layer 450 may minimize reflection by the microlens 440 to prevent light sensitivity from decreasing.

Figure 9:
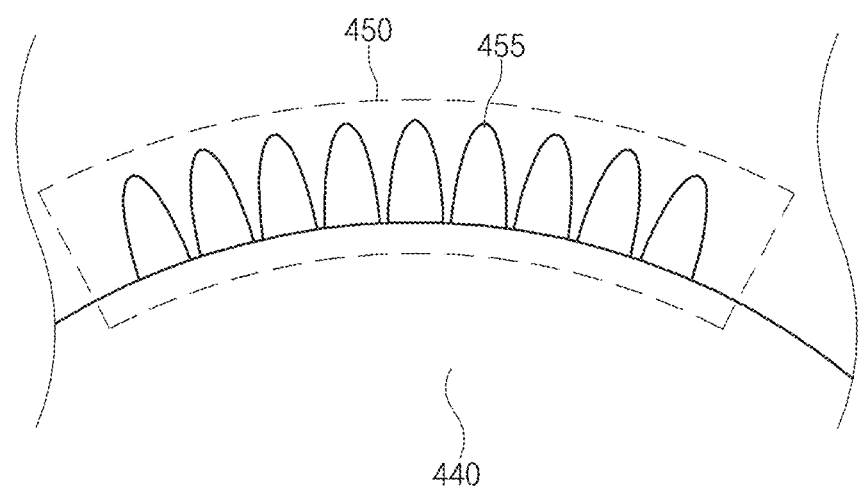
FIG. 9 is a view illustrating an example of an antireflection layer illustrated in FIGS. 7 and 8.

FIG. 9 is a view illustrating an example of the antireflection layer illustrated in FIGS. 7 and 8.

Referring to FIG. 9, reflection on a surface of a medium is caused by a difference in refractive index between media, and there is a slight difference (e.g., 0.3 to 0.6) in refractive index between the microlens 440 and an external medium (e.g., air). In order to reduce the reflection due to such a difference in refractive index, each of the first and second phase difference detection pixels RP and LP may include the antireflection layer 450.

The antireflection layer 450 may be configured by nanopatterns 455 which are disposed on the top of the microlens 440. Each of the nanopatterns 455 may have a circular (or elliptical) cross-section and may have a cone (or elliptical cone) shape with a rounded tip, whose cross-sectional area gradually decreases in an upward direction. Each of the nanopatterns 455 may have a height of about several tens of nm to several hundreds of nm and a distance between adjacent nanopatterns 455 may be constant, but the scope of the disclosed technology is not limited thereto. Such nanopatterns 455 may configure a moth eye nanostructure which is most effective for anti reflection.

A thickness of the antireflection layer 450 and the shape and spacing of the nanopatterns 455 may be experimentally determined to optimize the phase difference detection performance.

Hereinafter, a process for forming the antireflection layer 450 will be briefly described.

First, polystyrene balls (PS balls) may be closely distributed in a region where the antireflection layer 450 is to be disposed, on the top of the microlens 440. Then, a volume of each PS ball may be reduced by performing etching on the distributed PS balls through an $O_2$ plasma process. Due to this fact, spaces between the PS balls may be secured, and an Au (gold) film may be deposited in the spaces between the PS balls.

Thereafter, an etching process may be performed using the PS balls as an etch mask. The etching process may be a wet etching process using diluted hydrofluoric acid (HF). When shapes of the nanopatterns 455 are formed through such an etching process, the PS balls and the Au film may be removed. In order to improve durability and strength of the shapes of the nanopatterns 455, an oxide layer (SiOx) may be coated on the shapes of the nanopatterns 455. The formation of the nanopatterns 455 may be completed by etching the oxide layer SiOx through a $CF_4$ plasma process.

Figure 10:
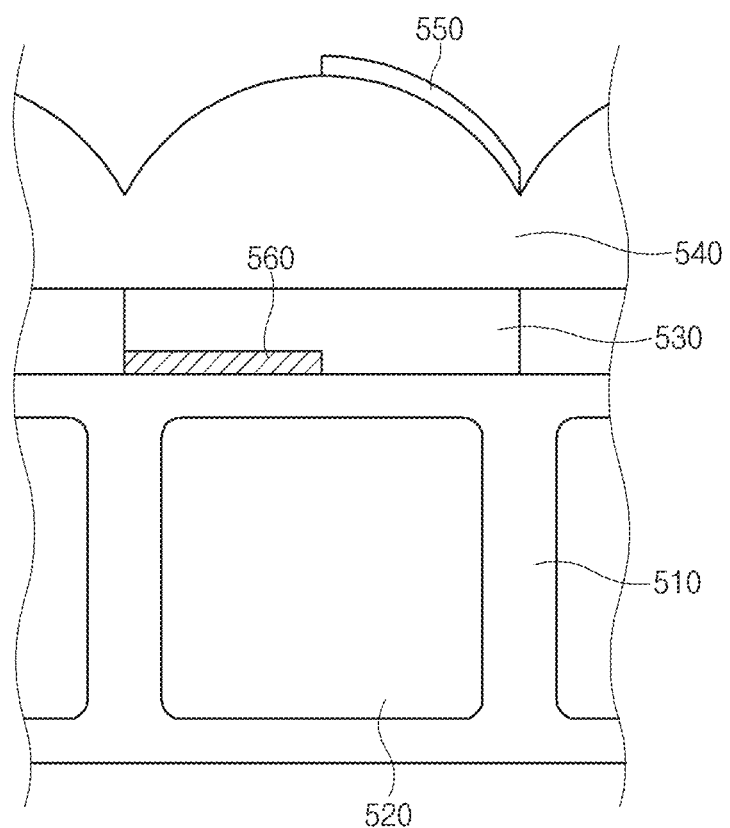
FIG. 10 is a cross-sectional view illustrating another example of the first phase difference detection pixel.

FIG. 10 is a cross-sectional view illustrating another example of the first phase difference detection pixel.

Referring to FIG. 10, a cross-section 500-1 of the first phase difference detection pixel may be a cross-section taken by cutting the first phase difference detection pixel RP illustrated in FIG. 3. A cutting direction may be the row direction or the column direction.

The cross-section 500-1 of the first phase difference detection pixel may include a substrate 510, a photoelectric conversion element 520, an optical filter 530, a microlens 540, an antireflection layer 550, and a light blocking layer 560. Since the components of the cross-section 500-1 of the first phase difference detection pixel have substantially the same structures and functions as those of the cross-section 400-1 of the first phase difference detection pixel described above with reference to FIG. 7, only differences from the cross-section 400-1 of the first phase difference detection pixel will be mainly described below for the sake of convenience in explanation.

In the cross-section 500-1 of the first phase difference detection pixel, the light blocking layer 560 may be disposed not on the top of the microlens 540 but at the bottom of the optical filter 530. The light blocking layer 560 may cover a left half of the bottom of the optical filter 530 when viewed from the center of the first phase difference detection pixel RP. The light blocking layer 560 may block (reflect or absorb) an optical signal incident from the outside not to transfer the optical signal into the photoelectric conversion element 520 of the first phase difference detection pixel RP. In another embodiment, the light blocking layer 560 may be disposed between the optical filter 530 and the microlens 540.

As the left half of the bottom of the optical filter 530 is covered by the light blocking layer 560, the light blocking region 300 of the first phase difference detection pixel RP may be realized. Moreover, as a right half of the top of the microlens 540 is covered by the antireflection layer 550, the light receiving region 310 of the first phase difference detection pixel RP may be realized. Although, due to the presence of the light blocking layer 560, an amount of an optical signal incident on the photoelectric conversion element 520 of the first phase difference detection pixel RP is smaller than that in the case of a color pixel having no light blocking layer 560, the antireflection layer 550 may minimize reflection by the microlens 540 to prevent light sensitivity from decreasing.

Figure 11:
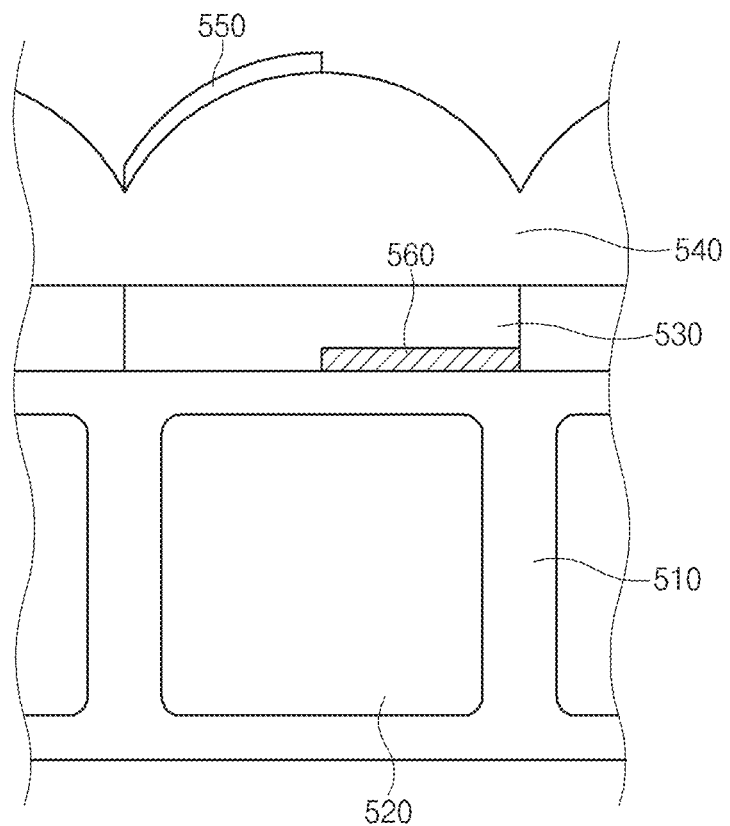
FIG. 11 is a cross-sectional view illustrating another example of the second phase difference detection pixel.

FIG. 11 is a cross-sectional view illustrating another example of the second phase difference detection pixel.

Referring to FIG. 11, a cross-section 500-2 of the second phase difference detection pixel may be a cross-section taken by cutting the second phase difference detection pixel LP illustrated in FIG. 3. A cutting direction may be the row direction or the column direction, but may be the same direction as that of the cross-section 500-1 of the first phase difference detection pixel described above with reference to FIG. 10.

The cross-section 500-2 of the second phase difference detection pixel may include the substrate 510, the photoelectric conversion element 520, the optical filter 530, the microlens 540, the antireflection layer 550, and the light blocking layer 560. Since the cross-section 500-2 of the second phase difference detection pixel has, except for some differences, a structure and function corresponding to those of the cross-section 500-1 of the first phase difference detection pixel described above with reference to FIG. 10, only the differences from the cross-section 500-1 of the first phase difference detection pixel will be mainly described below for the sake of convenience in explanation.

The antireflection layer 550 may cover a left half of the top of the microlens 540 when viewed from the center of the second phase difference detection pixel LP.

The light blocking layer 560 may cover a right half of the bottom of the optical filter 530 when viewed from the center of the second phase difference detection pixel LP.

As the right half of the bottom of the optical filter 530 is covered by the light blocking layer 560, the light blocking region 300 of the second phase difference detection pixel LP may be realized. Moreover, as the left half of the top of the microlens 540 is covered by the antireflection layer 550, the light receiving region 310 of the second phase difference detection pixel LP may be realized. Although, due to the presence of the light blocking layer 560, an amount of an optical signal incident on the photoelectric conversion element 520 of the second phase difference detection pixel LP is smaller than that in the case of a color pixel having no light blocking layer 560, the antireflection layer 550 may minimize reflection by the microlens 540 to prevent light sensitivity from decreasing.

Figure 12A:
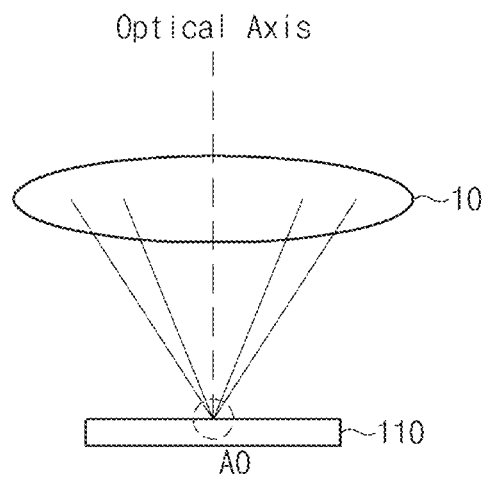
FIGS. 12A-12C illustrate an example of an autofocus operation based on some embodiments of the disclosed technology.
Figure 12B:
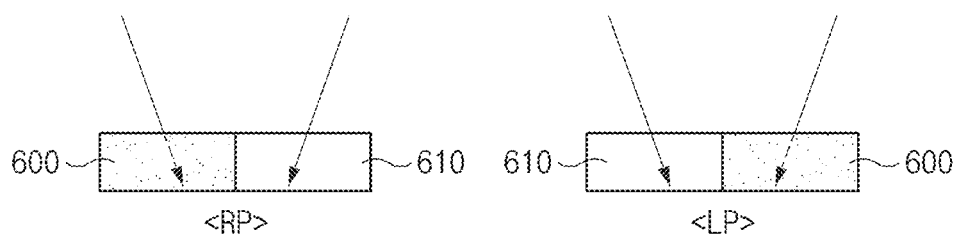
Figure 12C:
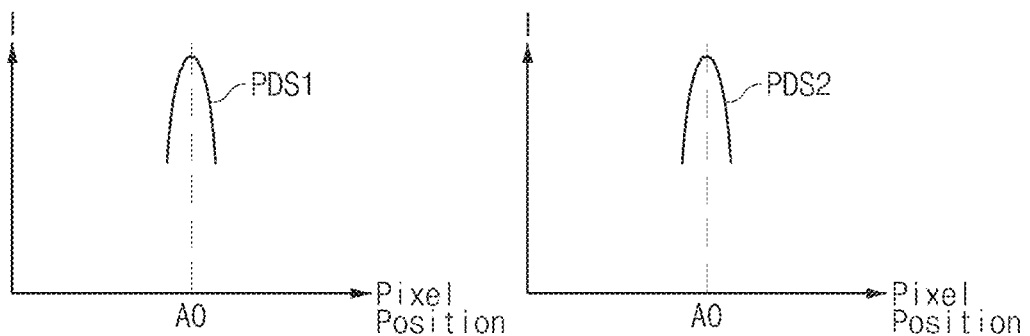

FIGS. 12A-12C illustrate an example of an autofocus operation based on some embodiments of the disclosed technology.

More specifically FIGS. 12A-12C illustrate a case where a focus state for a subject is an in-focus state. In the in-focus state, as illustrated in FIG. 12A, an optical signal incident on the image sensor 100 through the lens 10 is focused at a center part A0 of the light receiving surface of the image sensor 100.

In such an in-focus state, as illustrated in FIG. 12B, both the first phase difference detection pixel RP and the second phase difference detection pixel LP at the center part A0 of the light receiving surface may receive light, and valid phase difference detection signals may be detected at the center part A0. The first phase difference detection pixel RP has a sub light receiving region 600 which is disposed at a left side and a light receiving region 610 shifted by a certain displacement distance in a right direction. The second phase difference detection pixel LP has a sub light receiving region 600 which is disposed at a right side and a light receiving region 610 shifted by a certain displacement distance in a left direction. The sub light receiving region 600 may indicate a region whose light transmittance is lower than that of the light receiving region 610 by a predetermined percentage. For example, the sub light receiving region 600 may have a light transmittance corresponding to about 50% of the light transmittance of the light receiving region 610. Of light incident on the first phase difference detection pixel RP or the second phase difference detection pixel LP, light indicated by the solid line indicates light incident with a relatively high light transmittance, and light indicated by the dotted line indicates light incident with a relatively low light transmittance.

The focus detector 250 may calculate a pixel shift value that minimizes a correlation operation value, through a correlation operation between a first phase difference detection signal PDS1 generated by the first phase difference detection pixels RP and a second phase difference detection signal PDS2 generated by the second phase difference detection pixels LP. As illustrated FIG. 12C, by comparing (by performing a correlation calculation) a pattern of the first phase difference detection signal PDS1 and a pattern of the second phase difference detection signal PDS2 which are plotted on graphs for pixel position and signal intensity, the focus detector 250 may calculate a pixel shift value that is required to match (or approximate) the pattern of the first phase difference detection signal PDS1 and the pattern of the second phase difference detection signal PDS2. If the calculated pixel shift value is equal to or less than a predetermined threshold value, a focus state may be determined as the in-focus state, and the focus detector 250 may control the lens driver 30 not to move the lens 10.

The pattern of the first phase difference detection signal PDS1 and the pattern of the second phase difference detection signal PDS2 illustrated in FIG. 12C may have higher signal levels than the pattern of the first phase difference detection signal PDS1 and the pattern of the second phase difference detection signal PDS2 illustrated in FIG. 4C, respectively. This is because the sub light receiving region 600 may also transmit partially an optical signal. Due to this fact, since the pattern of the first phase difference detection signal PDS1 and the pattern of the second phase difference detection signal PDS2 may be identified even in low illumination environment where an optical signal is insufficient, the autofocus performance may be improved.

Figure 13A:
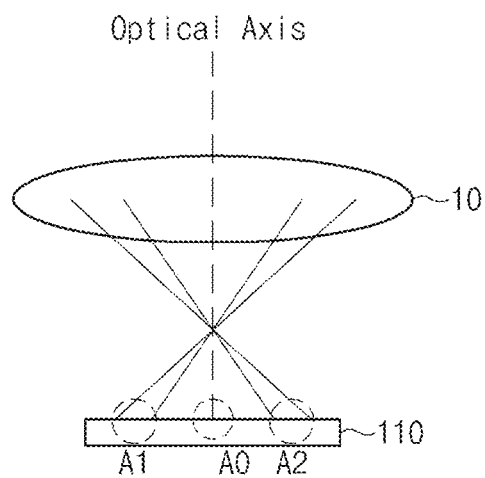
FIGS. 13A-13C illustrate an example of an autofocus operation based on some embodiments of the disclosed technology.
Figure 13B:
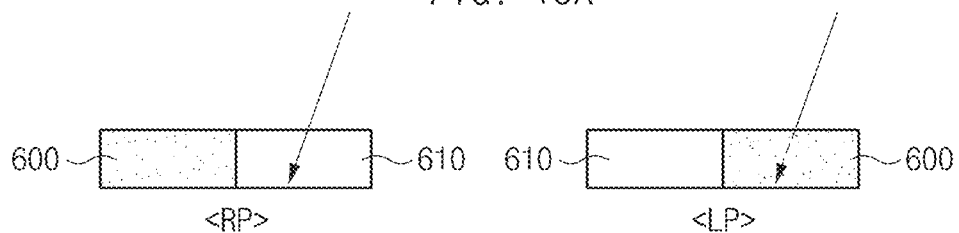
Figure 13C:
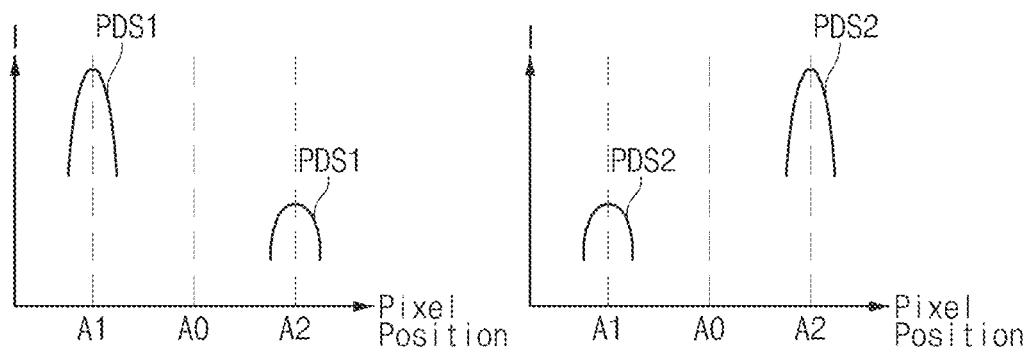

FIGS. 13A-13C illustrate an example of an autofocus operation based on some embodiments of the disclosed technology.

More specifically FIGS. 13A-13C illustrate a case where a focus state for a subject is a front focus state. In the front focus state, as illustrated in FIG. 13A, an optical signal incident on the image sensor 100 through the lens 10 is focused not at the center part A0 of the light receiving surface of the image sensor 100 but in front of the light receiving surface.

In such a front focus state, as illustrated in FIG. 13B, in a first region A1 which is positioned in the left direction from the optical axis, since the first phase difference detection pixel RP has the light receiving region 610 shifted by a certain displacement distance in the right direction, an optical signal may reach the first phase difference detection pixel RP with a high light transmittance. However, since the second phase difference detection pixel LP has the light receiving region 610 shifted by a certain displacement distance in the left direction, an optical signal may be incident on the sub light receiving region 600 and thus may reach the second phase difference detection pixel LP with a low light transmittance. Conversely, in a second region A2 which is positioned in the right direction from the optical axis, an optical signal may reach into the first phase difference detection pixel RP with a low light transmittance, and may reach the second phase difference detection pixel LP with a high light transmittance.

As illustrated in FIG. 13C, a pattern of the first phase difference detection signal PDS1 and a pattern of the second phase difference detection signal PDS2 may be plotted together in the first region A1, and an average level of the pattern of the first phase difference detection signal PDS1 may be higher than an average level of the pattern of the second phase difference detection signal PDS2. Even in the second region A2, a pattern of the first phase difference detection signal PDS1 and a pattern of the second phase difference detection signal PDS2 may be plotted together, and an average level of the pattern of the first phase difference detection signal PDS1 may be lower than an average level of the pattern of the second phase difference detection signal PDS2. This is because the light transmittances of the light receiving region 610 and the sub light receiving region 600 are different from each other.

For the sake of simpler explanation, between the patterns of each of the first phase difference detection signal PDS1 and the second phase difference detection signal PDS2, a pattern whose average level is high is defined as a main pattern, and a pattern whose average level is low is defined as a sub pattern. An illumination depending on an amount of light incident on the image sensor 100 may be divided into a low illumination, a medium illumination and a high illumination. The low illumination may indicate a state in which the sub pattern of each of the first phase difference detection signal PDS1 and the second phase difference detection signal PDS2 is not plotted because an amount of light is low. The medium illumination may indicate a state in which the main pattern and the sub-pattern of each of the first phase difference detection signal PDS1 and the second phase difference detection signal PDS2 are plotted because an amount of light is within an appropriate range. The high illumination may indicate a state in which the main pattern of each of the first phase difference detection signal PDS1 and the second phase difference detection signal PDS2 is saturated and thus is not plotted because an amount of light is high. The low illumination and the high illumination may be referred to as a first illumination and a second illumination, respectively.

First, in the low illumination, since the sub pattern of each of the first phase difference detection signal PDS1 and the second phase difference detection signal PDS2 is not plotted, the focus detector 250 may calculate a pixel shift value using the main pattern of the first phase difference detection signal PDS1 and the main pattern of the second phase difference detection signal PDS2.

Next, in the medium illumination, since both the main pattern and the sub pattern of each of the first phase difference detection signal PDS1 and the second phase difference detection signal PDS2 are plotted, the focus detector 250 may calculate a pixel shift value using the main pattern of the first phase difference detection signal PDS1 and the main pattern of the second phase difference detection signal PDS2 or using the sub pattern of the first phase difference detection signal PDS1 and the sub pattern of the second phase difference detection signal PDS2. In some embodiments of the disclosed technology, the focus detector 250 may calculate a pixel shift value using the main pattern of the first phase difference detection signal PDS1 and the sub pattern of the first phase difference detection signal PDS1 or using the main pattern of the second phase difference detection signal PDS2 and the sub pattern of the second phase difference detection signal PDS2. In other embodiments of the disclosed technology, the focus detector 250 may determine a pixel shift value by comparing and verifying a pixel shift value calculated using the main pattern of the first phase difference detection signal PDS1 and the main pattern of the second phase difference detection signal PDS2 and a pixel shift value calculated using the sub pattern of the first phase difference detection signal PDS1 and the sub pattern of the second phase difference detection signal PDS2. As such, in a medium illumination condition, various pixel shift value calculation methods may be used in consideration of an operation amount and accuracy of the focus detector 250.

Lastly, in the high illumination, since the main pattern of each of the first phase difference detection signal PDS1 and the second phase difference detection signal PDS2 is not plotted, the focus detector 250 may calculate a pixel shift value using the sub pattern of the first phase difference detection signal PDS1 and the sub pattern of the second phase difference detection signal PDS2.

In each illumination condition, the focus detector 250 may calculate a defocus value corresponding to the calculated pixel shift value, and may transfer the defocus value to the lens driver 30, thereby moving the lens 10 to the in-focus position.

Namely, the focus detector 250 may calculate a defocus value by selectively using at least one of a method of comparing the main pattern of the first phase difference detection signal PDS1 and the main pattern of the second phase difference detection signal PDS2 and a method of comparing the sub pattern of the first phase difference detection signal PDS1 and the sub pattern of the second phase difference detection signal PDS2, depending on an illumination.

An illumination condition may be determined by the image signal processor 200 depending on whether a main pattern and a sub pattern are detected, or may be determined by the image signal processor 200 based on an amount of light detected through a separate illumination sensor (not illustrated). The image signal processor 200 may provide a determination result to the focus detector 250.

As described above, since the focus detector 250 may calculate a pixel shift value by selectively using a main pattern and a sub pattern in a low illumination or high illumination condition, the autofocus function may be normally realized even in a bad condition such as the low illumination or high illumination condition.

Figure 14A:
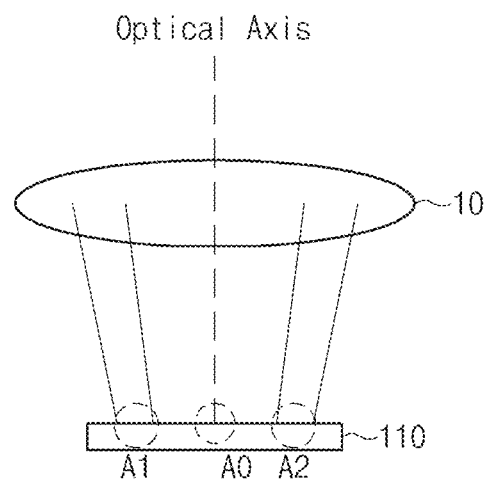
FIGS. 14A-14C illustrate an example of an autofocus operation based on some embodiments of the disclosed technology.
Figure 14B:
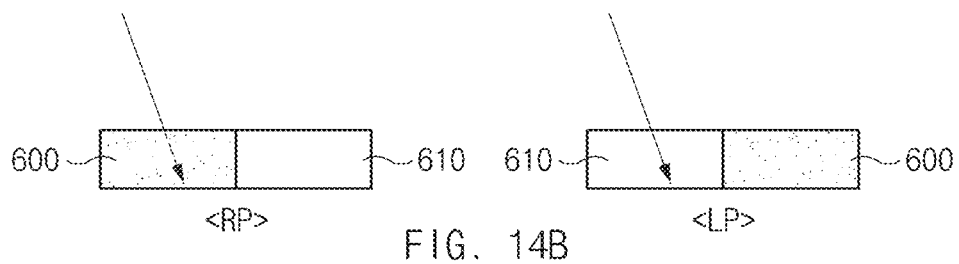
Figure 14C:
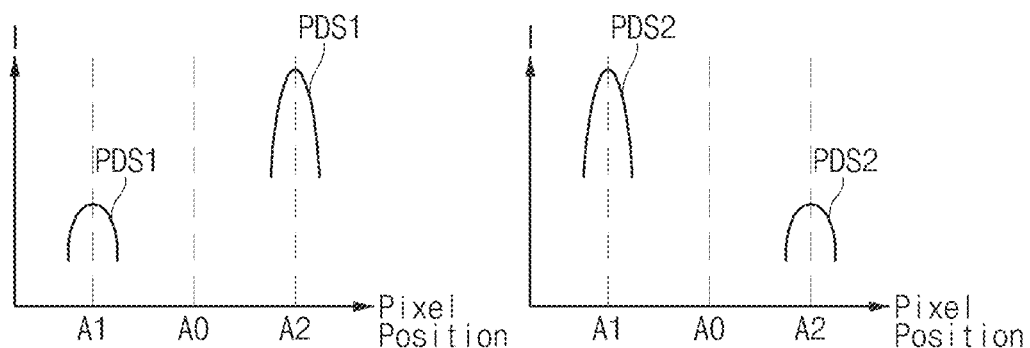

FIGS. 14A-14C illustrate an example of an autofocus operation based on some embodiments of the disclosed technology.

More specifically FIGS. 14A-14C illustrate a case where a focus state for a subject is a back focus state. In the back focus state, as illustrated in FIG. 14A, an optical signal incident on the image sensor 100 through the lens 10 is focused not at the center part A0 of the light receiving surface of the image sensor 100 but behind the light receiving surface.

In such a back focus state, as illustrated in FIG. 14B, in the first region A1 which is positioned in the left direction from the optical axis, since the first phase difference detection pixel RP has the light receiving region 610 shifted by a certain displacement distance in the right direction, an optical signal may be incident on the sub light receiving region 600 and thus may reach the first phase difference detection pixel RP with a low light transmittance. However, since the second phase difference detection pixel LP has the light receiving region 610 shifted by a certain displacement distance in the left direction, an optical signal may reach the second phase difference detection pixel LP with a high light transmittance. Conversely, in the second region A2 which is positioned in the right direction from the optical axis, an optical signal may reach the first phase difference detection pixel RP with a high light transmittance, and may reach the second phase difference detection pixel LP with a low light transmittance.

As illustrated in FIG. 14C, a pattern of the first phase difference detection signal PDS1 and a pattern of the second phase difference detection signal PDS2 may be plotted together in the first region A1, and an average level of the pattern of the first phase difference detection signal PDS1 may be lower than an average level of the pattern of the second phase difference detection signal PDS2. Even in the second region A2, a pattern of the first phase difference detection signal PDS1 and a pattern of the second phase difference detection signal PDS2 may be plotted together, and an average level of the pattern of the first phase difference detection signal PDS1 may be higher than an average level of the pattern of the second phase difference detection signal PDS2.

Since a method for the focus detector 250 to calculate a pixel shift value using the main pattern and the sub pattern of each of the first phase difference detection signal PDS1 and the second phase difference detection signal PDS2 in each of low illumination, medium illumination and high illumination conditions is substantially the same as what is described above with reference to FIG. 13C, the repeated explanation thereof will be omitted herein.

Figure 15:
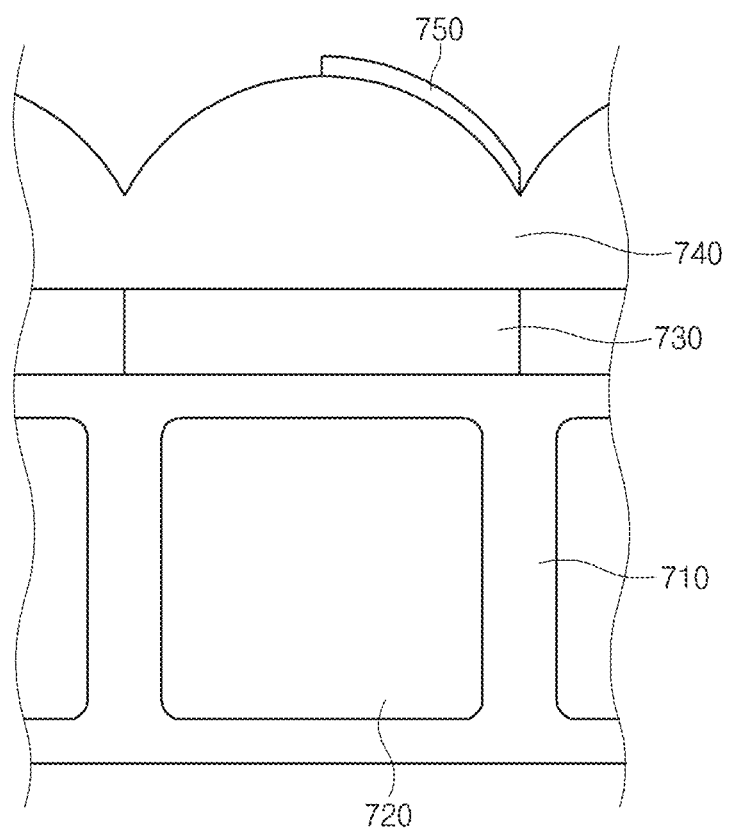
FIG. 15 is a cross-sectional view illustrating another example of the first phase difference detection pixel.

FIG. 15 is a cross-sectional view illustrating another example of the first phase difference detection pixel.

Referring to FIG. 15, a cross-section 700-1 of the first phase difference detection pixel may be a cross-section taken by cutting the first phase difference detection pixel RP illustrated in FIG. 3. A cutting direction may be the row direction or the column direction.

The cross-section 700-1 of the first phase difference detection pixel may include a substrate 710, a photoelectric conversion element 720, an optical filter 730, a microlens 740, and an antireflection layer 750. Since the components of the cross-section 700-1 of the first phase difference detection pixel have substantially the same structures and functions as those of the cross-section 400-1 of the first phase difference detection pixel described above with reference to FIG. 7, only differences from the cross-section 400-1 of the first phase difference detection pixel will be mainly described below for the sake of convenience in explanation.

A light blocking layer may be omitted from the cross-section 700-1 of the first phase difference detection pixel. That is to say, a right half of the top of the microlens 740 may be covered by the antireflection layer 750 when viewed from the center of the first phase difference detection pixel RP, but since no light blocking layer may be disposed on a left half of the top of the microlens 740, the microlens 740 may be exposed to the outside.

In another embodiment, a light retarding layer may be disposed on the left half of the top of the microlens 740. The light retarding layer may reduce the efficiency of light transfer to the interior of the microlens 740. For example, the light retarding layer may include a material which has a refractive index higher than that of the microlens 740. As another example, the light retarding layer may be realized in a form in which patterns made of a material (e.g., tungsten) having a high light absorption are disposed by being spaced apart at predetermined intervals.

Since no light blocking layer is disposed (or the light retarding layer is disposed) on the left half of the top of the microlens 740, the sub light receiving region 600 of the first phase difference detection pixel RP may be realized. Moreover, as the right half of the top of the microlens 740 is covered by the antireflection layer 750, the light receiving region 610 of the first phase difference detection pixel RP may be realized. In other words, as the antireflection layer 750 is disposed only on the right half of the top of the microlens 740, the sub light receiving region 600 having a low light transmittance and the light receiving region 610 having a high light transmittance may be realized. Namely, the antireflection layer 750 may be disposed only in the light receiving region 610 of the light receiving region 610 and the sub light receiving region 600.

Figure 16:
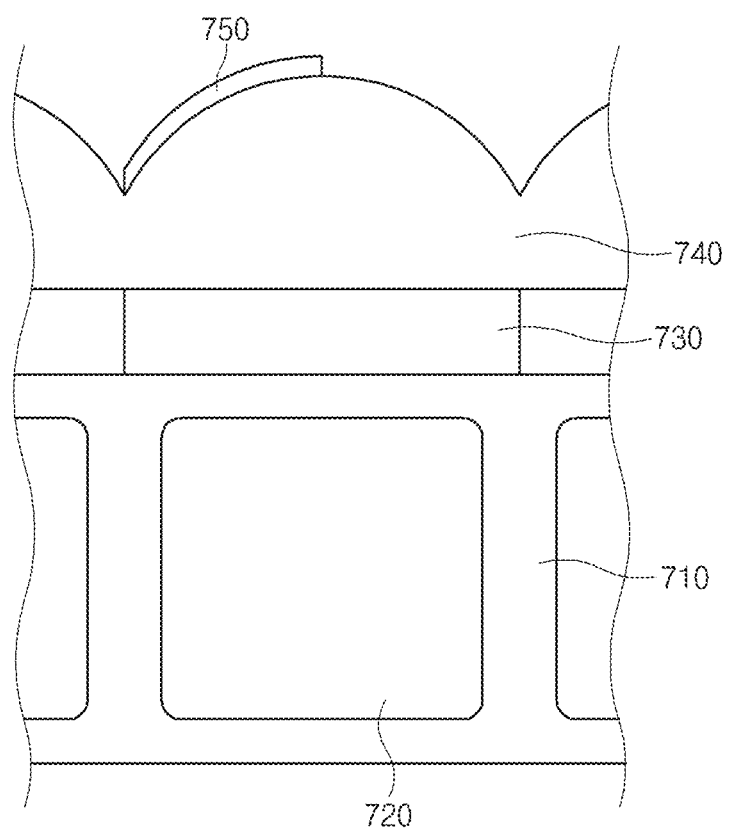
FIG. 16 is a cross-sectional view illustrating another example of the second phase difference detection pixel.

FIG. 16 is a cross-sectional view illustrating another example of the second phase difference detection pixel.

Referring to FIG. 16, a cross-section 700-2 of the second phase difference detection pixel may be a cross-section taken by cutting the second phase difference detection pixel LP illustrated in FIG. 3. A cutting direction may be the row direction or the column direction, but may be the same direction as that of the cross-section 700-1 of the first phase difference detection pixel described above with reference to FIG. 15.

The cross-section 700-2 of the second phase difference detection pixel may include the substrate 710, the photoelectric conversion element 720, the optical filter 730, the microlens 740, and the antireflection layer 750. Since the cross-section 700-2 of the second phase difference detection pixel has, except for some differences, a structure and function corresponding to those of the cross-section 700-1 of the first phase difference detection pixel described above with reference to FIG. 15, only the differences from the cross-section 700-1 of the first phase difference detection pixel will be mainly described below for the sake of convenience in explanation.

The antireflection layer 750 may cover a left half of the top of the microlens 740 when viewed from the center of the second phase difference detection pixel LP.

A light blocking layer may be omitted from the cross-section 700-2 of the second phase difference detection pixel. That is to say, the left half of the top of the microlens 740 may be covered by the antireflection layer 750 when viewed from the center of the second phase difference detection pixel LP, but since no light blocking layer may be disposed on a right half of the top of the microlens 740, the microlens 740 may be exposed to the outside.

In another embodiment, a light retarding layer may be disposed on the right half of the top of the microlens 740. The light retarding layer may reduce the efficiency of light transfer to the interior of the microlens 740. For example, the light retarding layer may include a material which has a refractive index higher than that of the microlens 740. As another example, the light retarding layer may be realized in a form in which patterns made of a material (e.g., tungsten) having a high light absorption are disposed by being spaced apart at predetermined intervals.

Since no light blocking layer is disposed (or the light retarding layer is disposed) on the right half of the top of the microlens 740, the sub light receiving region 600 of the second phase difference detection pixel LP may be realized. Moreover, as the left half of the top of the microlens 740 is covered by the antireflection layer 750, the light receiving region 610 of the second phase difference detection pixel LP may be realized. In other words, as the antireflection layer 750 is disposed only on the left half of the top of the microlens 740, the sub light receiving region 600 having a low light transmittance and the light receiving region 610 having a high light transmittance may be realized. Namely, the antireflection layer 750 may be disposed only in the light receiving region 610 of the light receiving region 610 and the sub light receiving region 600.

While it was described in the embodiments of the disclosed technology that each of an antireflection layer, a light blocking layer and a light retarding layer is disposed on a left or right half of a microlens, it is to be noted that the scope of the disclosed technology is not limited thereto. That is to say, each of the antireflection layer, the light blocking layer and the light retarding layer may be disposed to occupy an area corresponding to a predetermined percentage in the area of the microlens. For example, the antireflection layer may be disposed in an area corresponding to a first percentage in the area of the microlens, and the light blocking layer or light retarding layer may be disposed in an area corresponding to a second percentage in the area of the microlens. In the embodiment of FIG. 7 or FIG. 15, each of the first percentage and the second percentage corresponds to 0.5. In another embodiment, the first percentage and the second percentage may be arbitrarily changed, and the sum of the first percentage and the second percentage may be 1.

The exemplary embodiments of the disclosed technology have been described above with reference to the accompanying drawings, but those skilled in the art will understand that the disclosed technology may be implemented in another particular form without changing the technical spirit or an essential feature thereof. Therefore, the aforementioned exemplary embodiments are all illustrative and are not restricted to a limited form.

What is claimed is:

1. An image sensor comprising:
   a plurality of imaging pixels to detect incident light to produce pixel signals representing an image carried by the incident light;
   a first phase difference detection pixel located among the imaging pixels and including a light receiving region shifted by a first displacement distance in a first direction; and
   a second phase difference detection pixel located among the imaging pixels and including a light receiving region shifted by a second displacement distance in a second direction opposite to the first direction,
   wherein the first and second phase difference detection pixels are structured to detect phase difference information of incident light for controlling focusing of incident light at the imaging pixels for image sensing by the imaging pixels, and each of the first phase difference detection pixel and the second phase difference detection pixel includes an antireflection layer structured to partially cover a microlens of each of the first phase difference detection pixel and the second phase difference detection pixel, in the light receiving region.

2. The image sensor according to claim 1, wherein the antireflection layer includes a plurality of nanopatterns.

3. The image sensor according to claim 2, wherein each of the plurality of nanopatterns has a cross-sectional area that gradually decreases in an upward direction.

4. The image sensor according to claim 1, wherein each of the first phase difference detection pixel and the second phase difference detection pixel includes a light blocking region arranged adjacent to the light receiving region to partially block light.

5. The image sensor according to claim 4, wherein each of the first phase difference detection pixel and the second phase difference detection pixel includes a light blocking layer structured to partially cover the microlens, in the light blocking region.

6. The image sensor according to claim 4, wherein each of the first phase difference detection pixel and the second phase difference detection pixel includes a light blocking layer disposed under an optical filter, in the light blocking region.

7. The image sensor according to claim 1, wherein each of the first phase difference detection pixel and the second phase difference detection pixel includes a sub light receiving region arranged adjacent to the light receiving region.

8. The image sensor according to claim 7, wherein the antireflection layer included in each of the first phase difference detection pixel and the second phase difference detection pixel is disposed in the light receiving region of the light receiving region and the sub light receiving region.

9. The image sensor according to claim 7, wherein each of the first phase difference detection pixel and the second phase difference detection pixel includes alight retarding layer including, over the microlens, a material with a refractive index higher than the microlens, in the sub light receiving region.

10. The image sensor according to claim 1, wherein the light receiving region occupies a half of an area of the microlens.

11. A photographing apparatus comprising:
an image sensor including a first phase difference detection pixel structured to include a light receiving region shifted by a first displacement distance in a first direction and a second phase difference detection pixel structured to include a light receiving region shifted by a second displacement distance in a second direction opposite to the first direction;
a focus detector configured to calculate a defocus value based on a first phase difference detection signal of the first phase difference detection pixel and a second phase difference detection signal of the second phase difference detection pixel; and
a lens driver configured to adjust a position of a lens disposed in front of the image sensor, depending on the defocus value,
wherein each of the first phase difference detection pixel and the second phase difference detection pixel includes an antireflection layer structured to partially cover a microlens of each of the first phase difference detection pixel and the second phase difference detection pixel, in the light receiving region.

12. The photographing apparatus according to claim 11, wherein each of the first phase difference detection pixel and the second phase difference detection pixel includes a light blocking region arranged adjacent to the light receiving region.

13. The photographing apparatus according to claim 12, wherein the focus detector calculates a defocus value by comparing a pattern of the first phase difference detection signal and a pattern of the second phase difference detection signal.

14. The photographing apparatus according to claim 11, wherein each of the first phase difference detection pixel and the second phase difference detection pixel includes a sub light receiving region arranged adjacent to the light receiving region.

15. The photographing apparatus according to claim 14, wherein the focus detector calculates a defocus value by selectively using at least one of a method of comparing a main pattern of the first phase difference detection signal and a main pattern of the second phase difference detection signal and a method of comparing a sub pattern of the first phase difference detection signal and a sub pattern of the second phase difference detection signal, depending on an intensity of illumination.

16. The photographing apparatus according to claim 15, wherein, in a first illumination, the focus detector calculates a defocus value by comparing a main pattern of the first phase difference detection signal and a main pattern of the second phase difference detection signal, and
wherein, at a second illumination higher than the first illumination, the focus detector calculates a defocus value by comparing a sub pattern of the first phase difference detection signal and a sub pattern of the second phase difference detection signal.

17. An image sensor comprising:
a plurality of photoelectric conversion elements structured to capture optical signals and detect a phase difference in the optical signals;
a plurality of microlenses arranged over the plurality of photoelectric conversion elements to focus incident light on the plurality of photoelectric conversion elements;
at least one light blocking layer structured to cover a portion of at least one of the microlenses to partially block light from reaching at least a portion of at least one of the plurality of photoelectric conversion elements; and
at least one antireflection layer structured to cover another portion of the at least one of the microlenses to reduce a reflection of light at the at least one of the microlenses, wherein the at least one light blocking layer and the at least one antireflection layer are structured to cover the same microlens in a phase difference detection pixel structured to detect phase difference information of incident light for controlling focusing of incident light.

18. The image sensor according to claim 17, wherein the at least one antireflection layer includes a plurality of nanopatterns arranged on a surface of the at least one of the microlenses.

* * * * *